United States Patent
Sunkavalli et al.

(10) Patent No.: US 7,358,761 B1
(45) Date of Patent: Apr. 15, 2008

(54) VERSATILE MULTIPLEXER-STRUCTURES IN PROGRAMMABLE LOGIC USING SERIAL CHAINING AND NOVEL SELECTION SCHEMES

(75) Inventors: Ravi Sunkavalli, Milpitas, CA (US); Hare Krishna Verma, Cupertino, CA (US); Sudip Nag, San Jose, CA (US); Elliott Delaye, San Jose, CA (US)

(73) Assignee: Csitch Corporation, Santa Clara, CA (US)

( * ) Notice: Subject to any disclaimer, the term of this patent is extended or adjusted under 35 U.S.C. 154(b) by 0 days.

(21) Appl. No.: 11/040,633

(22) Filed: Jan. 21, 2005

(51) Int. Cl.
*H03K 19/173* (2006.01)
(52) U.S. Cl. .......................... 326/38; 326/46
(58) Field of Classification Search ........... 326/37–41, 326/46
See application file for complete search history.

(56) References Cited

U.S. PATENT DOCUMENTS

| | | | |
|---|---|---|---|
| 5,452,239 A | 9/1995 | Dai et al. | |
| 5,629,886 A * | 5/1997 | New | 708/711 |
| 5,744,995 A * | 4/1998 | Young | 327/407 |
| RE37,195 E | 5/2001 | Kean | |
| 6,389,379 B1 | 5/2002 | Lin et al. | |
| 6,445,209 B1 * | 9/2002 | Young et al. | 326/41 |
| 6,556,042 B1 * | 4/2003 | Kaviani | 326/39 |
| 6,603,332 B2 | 8/2003 | Kaviani et al. | |
| 6,806,732 B1 * | 10/2004 | Kaviani | 326/39 |
| 6,847,228 B1 * | 1/2005 | Crotty et al. | 326/38 |
| 2003/0071653 A1 * | 4/2003 | Carberry et al. | 326/40 |

\* cited by examiner

*Primary Examiner*—Don Le
(74) *Attorney, Agent, or Firm*—Peter Su

(57) ABSTRACT

Logic design apparatus and method provides serial multiplexer chains in a programmable logic fabric, each element in the chain either selects output of block, or passes output from earlier element of the chain. Select line is a decoder structure or output from configurable function generator that is configured at power-on to create correct selection. Using such structure, larger multiplexer, including priority multiplexers, tristate buses or larger look-up tables (LUTs) can be created. These novel structures can implement priority, non-priority or tristate multiplexers.

23 Claims, 10 Drawing Sheets

$$MY = I1 \cdot S' + I0 \cdot S$$
MY if I0 is 0
$$MY_{I0=0} = I1 \cdot S'$$
MY if I0 is 1
$$MY_{I0=1} = I1 + S$$
Figure 5a
The fast MUX chain is:
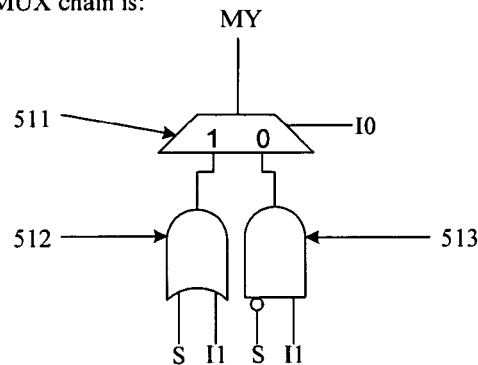
Figure 5b
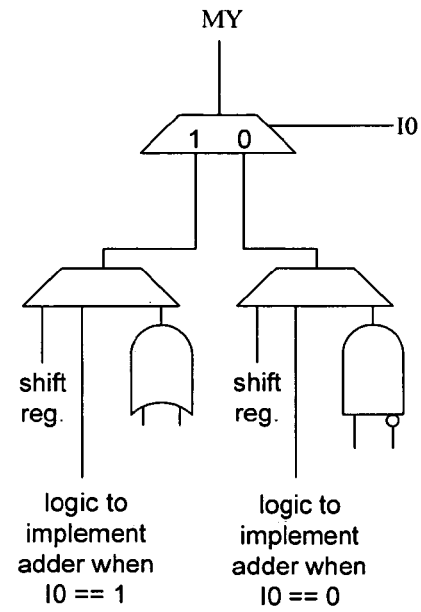
Figure 5c

VERSATILE MULTIPLEXER-STRUCTURES IN PROGRAMMABLE LOGIC USING SERIAL CHAINING AND NOVEL SELECTION SCHEMES

FIELD

The invention relates to reconfigurable logic, particularly to apparatus and method for reconfiguring logic using serially-interconnected multiplexers.

BACKGROUND OF INVENTION

Various reconfigurable logic devices, such as field programmable gate arrays (FPGA) are available commercially, from companies such as Xilinx, Actel, and Altera. However, such conventional reconfigurable devices are limited in terms of programmability or functionality for realizing different logic structures.

For example, designers may implement logic in large multiplexers as programmable logic fabric using a tree like structure, as shown conventionally in FIG. 1a. Such multiplexer size is an 8:1 MUX, having data inputs 10 through 17, and select lines S0 through S2. Because the prior-art tree structure requires that connections be increased at first level 118 to implement larger multiplexers, it is difficult to create larger multiplexers due to size and space considerations. Levels 119 and 120 represent inputs of what could be a larger multiplexer structure. By adding on additional levels, such as 118, it is apparent that the resulting multiplexer structure would grow in size with each added level.

Accordingly, an improved approach for reconfigurable logic design is required.

SUMMARY

The invention resides in reconfigurable logic using serially-interconnected multiplexers. Preferably, a decoder structure uses serial multiplexer chaining to provide larger multiplexers.

In particular, logic design apparatus and software-automated method provides serial multiplexer chains in a programmable logic fabric, wherein one or more element in the chain either selects the output of that element, or passes output from earlier element of the chain. The select line is a decoder structure or output from a configurable function generator that is configured at power-on to enable correct selection. Using such structure, larger multiplexer, including priority multiplexers, tristate buses, or larger look up tables (LUTs) can be created. These novel structures can implement a MUX of priority, non-priority, and/or tristate multiplexers.

BRIEF DESCRIPTION OF DRAWINGS

FIG. 5a is a logic equation representing two logical outcomes as defined by setting configuration bit 10 to either of two possible settings in a faster implementation of FPGA serial MUX chain. The path from MUX-in, I0, to MUX-out, MY, is made much faster comparatively by eliminating effectively one or more delay elements in alternative or currently in-circuit approaches.

FIG. 5b shows an implementation of the logic equation in FIG. 5a in a fast FPGA serial MUX using a select input I0 that is output from lower serial MUX chain.

FIG. 5c is a schematic drawing of the carry select method to create a serial MUX chain with a fast path from I0 to MY. This configuration has 2 levels and highlights the path delay addition through logic elements.

DETAILED DESCRIPTION

In general, field programmable gate array (FPGA), and/or other reconfigurable logic may employ or otherwise configure a set of interconnected multiplexers (MUX), via a decoder or functionally equivalent structure preferably with serial chaining thereof to provide larger multiplexers or other desired logic.

As used herein, the term multiplexer, or MUX, is defined as any structure or the digital logic element used to perform multiplexing.

Serially coupled multiplexer chains preferably provide programmable logic fabric or equivalent digital behavior, where one or more element in the chain either selects the output of that element, or selects the output from an earlier element of such configurable chain. In particular, the value fed to a select line of such a logical chain element may be the output of a programmable decoder structure or the output from a configurable function generator that is configured at power-on to generate the desired selection.

Thus by using such scalable programmable logic architecture, larger multiplexer, including priority multiplexers, tristate buses and/or larger look up tables (LUTs) can be configured as desired to build, for example, prototype digital systems or combinatorial logic. Furthermore, these structures can be used to implement priority multiplexers, non-priority multiplexers, tristate multiplexers or other Boolean logic.

Figure 1A:
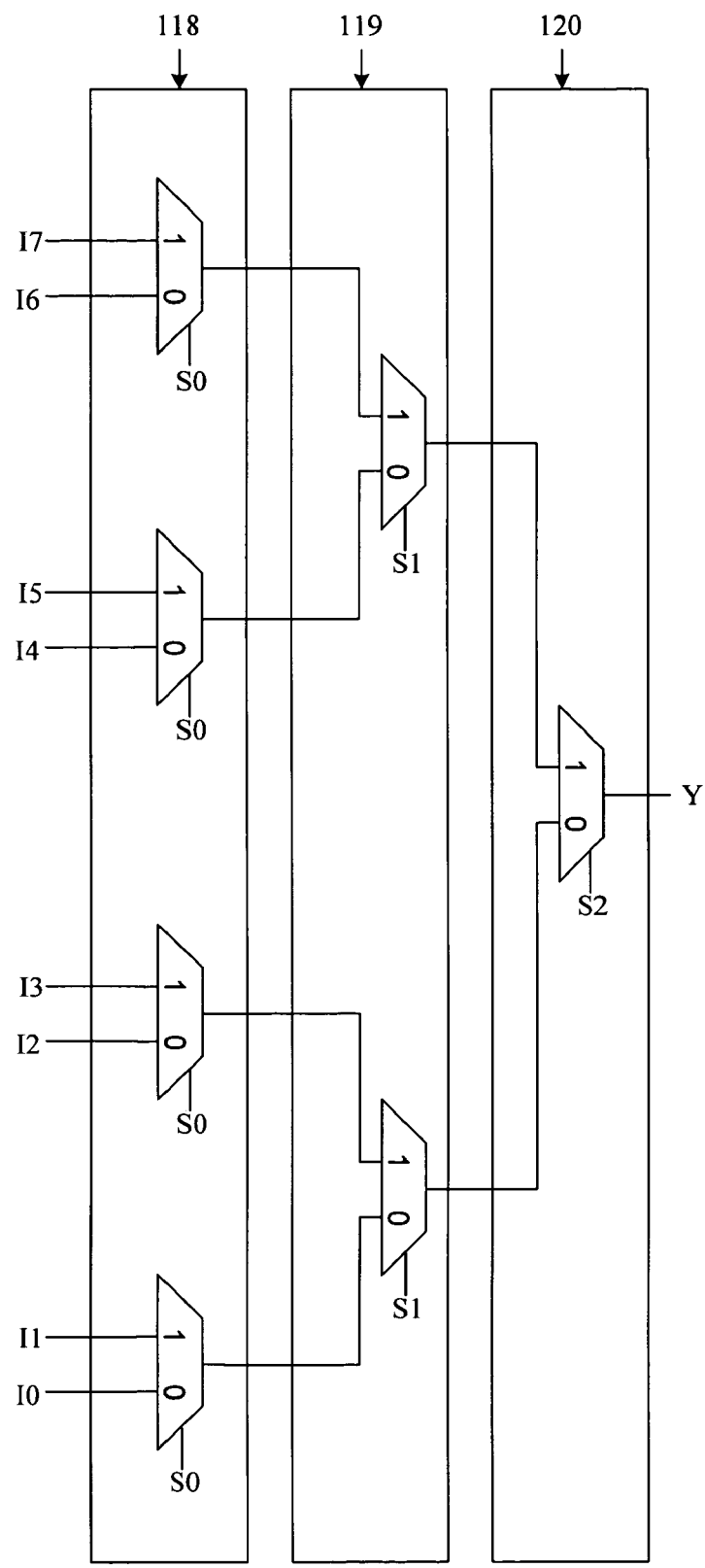
FIG. 1a is a schematic drawing of prior-art tree structure used as a multiplexer.
Figure 2:
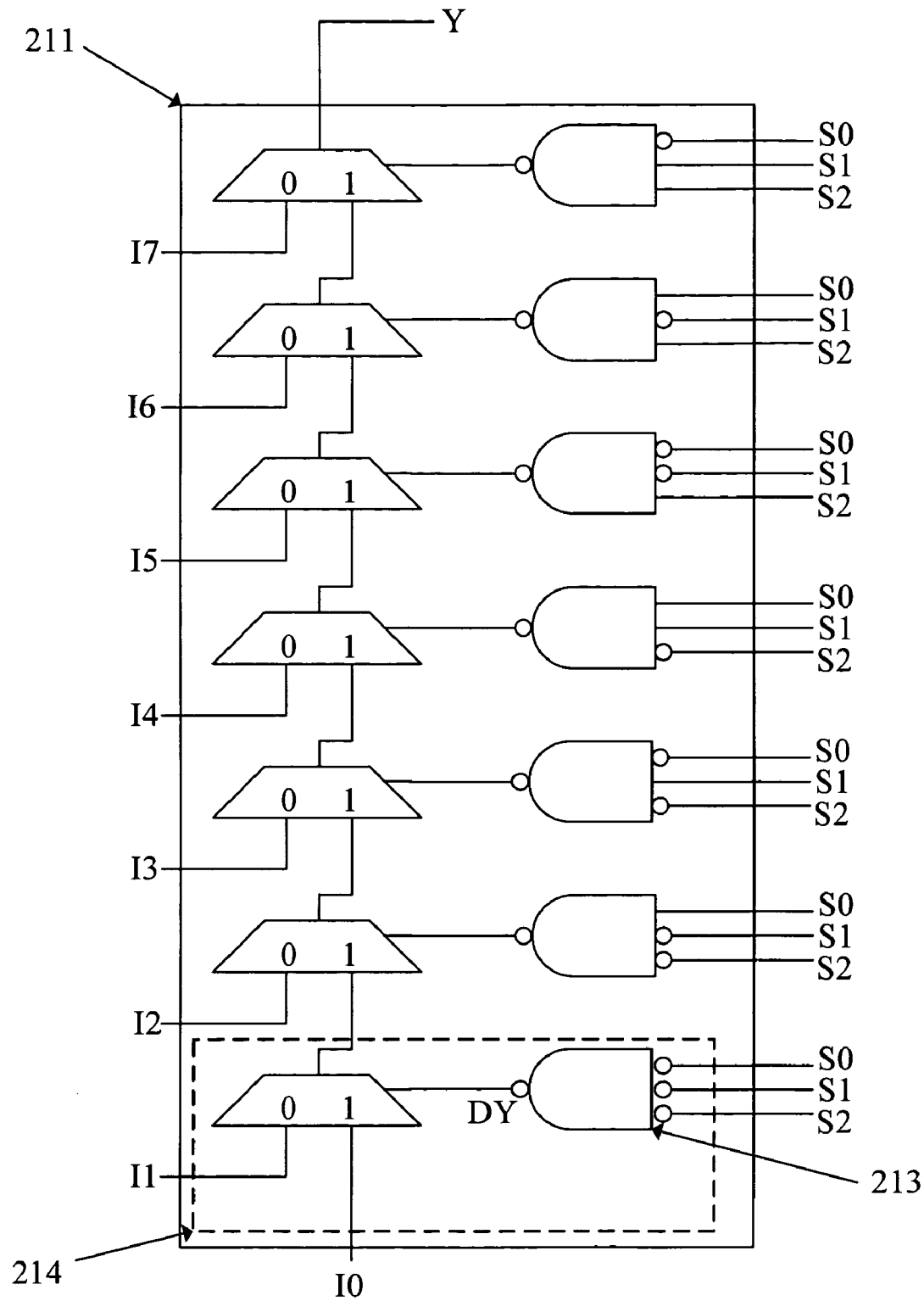
FIG. 2 is a schematic drawing of serial MUX chaining used to create larger multiplexers as implemented in one embodiment of the current invention.

FIG. 2 shows an implementation that converts the tree-like structure multiplexer of FIG. 1a to a serial MUX2 chaining 211 structure utilizing individual MUX2 chain elements 214 according to the programmable implementation described herein. As shown, a plurality of multiplexers are chained or otherwise coupled serially, each multiplexer being separately coupled further to a unique decoder NAND logic, such as NAND gate 213, for programming thereof. In a programmable logic fabric, this implementation has many benefits for flexible design and operation.

Optionally, serial MUX2 chain 211 with modified decoder structures of 213 can be coupled with one or more similar chains to implement even larger multiplexers. In such a case the number of select lines in each chain is commensurate with the number of inputs of that chain. For example, for two chains similar to 211 with eight inputs, it is possible to address the inputs on each chain with six select lines and appropriate configuration bits. Additionally, an n input multiplexer can be constructed using $\log_2(n)$ select lines.

Figure 3:
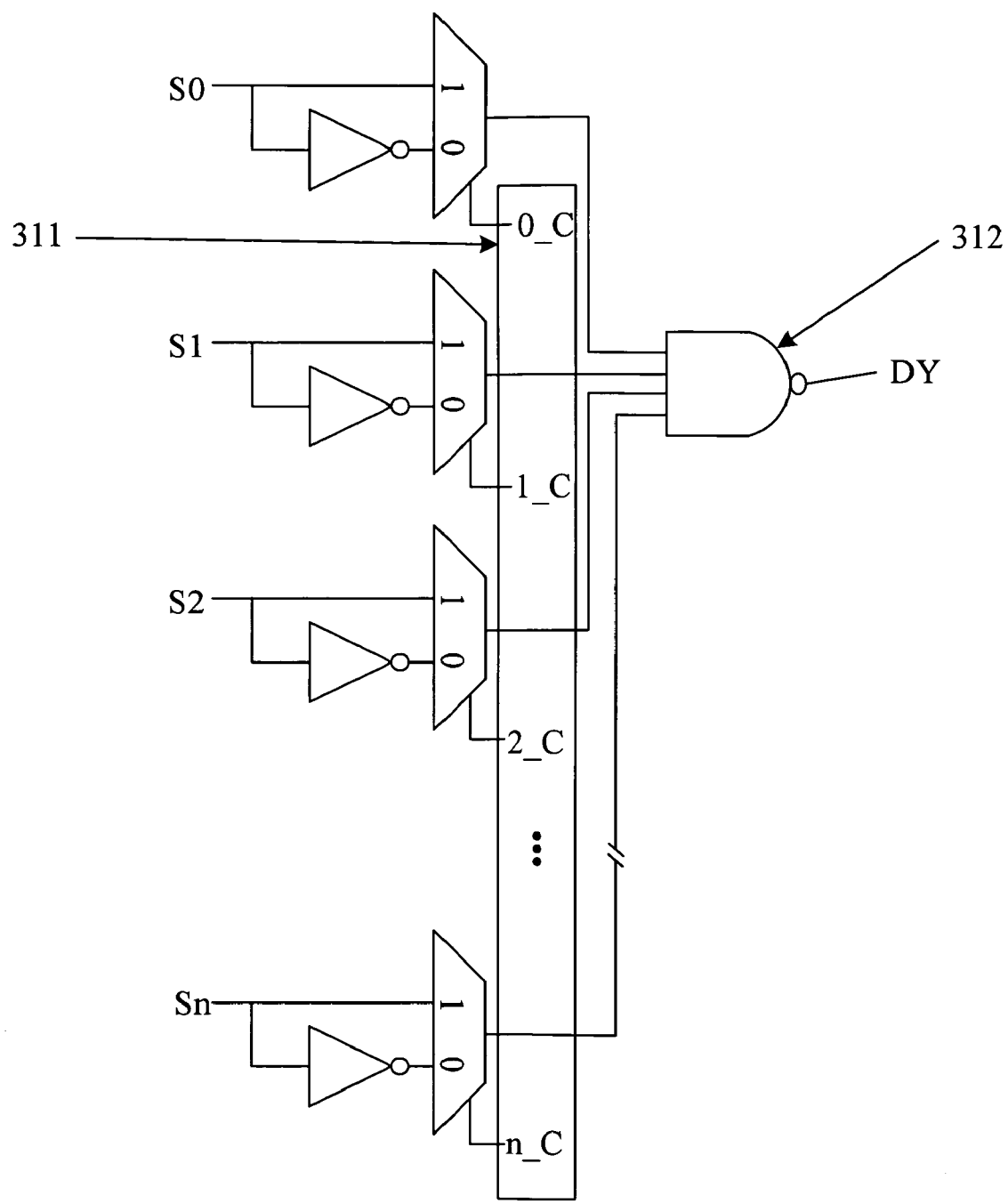
FIG. 3 is a schematic drawing of a n-input decoder as implemented in one embodiment of the current invention.

More particularly regarding decoder logic, FIG. 3 shows a representative decoder implementation with DY output of the decoder; here signal lines 311, 0_C through n_C, serve as memory configuration bits or digital settings, preferably written into synchronously or asynchronously at power-on or other pre-selected condition or event of the reconfigurable device. By writing different values in the configuration bits, different decoder outputs can be obtained based on values fed to the select lines S0 through Sn. In one embodiment of the invention, the configuration bits are written to via a programmable software application or firmware instructions coupled thereto. The logic output at DY of FIG. 3 is determined by the logical output of NAND function 312 of the values passed to select lines S0 through Sn as determined by configuration bits 0_C through n_C. Based on the deterministic nature of the decoder logic function of configuration bits and select lines, it is contemplated that software can determine the necessary decoder characteristics, configuration bit values and select line values to simulate and design a wide range of multiplexers and logic functions.

In one embodiment of the current invention, software can be written to translate symbolic or schematic designs into a layout of serially coupled multiplexers. This is useful in the implementation of an electronic design automation system typically used by circuit designers. Many logical elements can be constructed using serially coupled multiplexers, as illustrated in FIGS. 4a, 4b, 5a, 5b, 7a, and 7b. By analyzing a desired schematic design of a circuit, it is possible to determine, in software, what configuration of serially couple multiplexers and configuration bits are needed to construct and equivalent circuit. The equivalent circuit design can then be output for use in analysis or manufacture of circuits including, but limited to, decoders, LUTS, adders, and multiplexers.

Figure 4A:
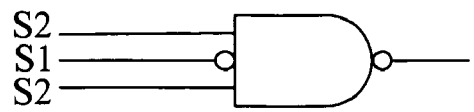
FIG. 4a is a functional schematic drawing of a decoder as implemented in one embodiment of the current invention.
Figure 4B:
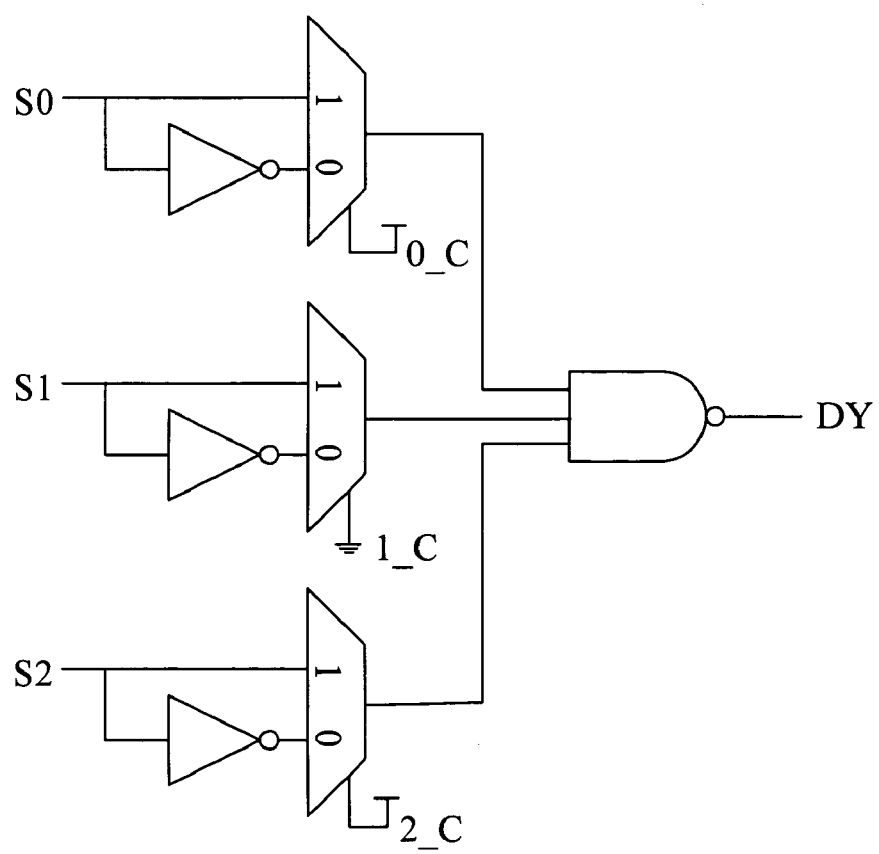
FIG. 4b is a schematic drawing of a decoder as implemented in one embodiment of the current invention with configuration bits fixed to a value. It shows an implementation of the current invention equivalent to the NAND structure depicted in FIG. 4a for use in the structure depicted in FIG. 2.

In addition for illustration, FIGS. 4a and 4b show a sample decoder implementation with the necessary configuration values. FIG. 4b shows an equivalent structure to that shown in FIG. 4a as implemented in one embodiment of the present invention. By reprogramming configuration bits 0_C through 2_C, the structure of FIG. 4b has the flexibility to provide various outputs at DY with a particular set of select line values at S0 through S2.

Figure 1B:
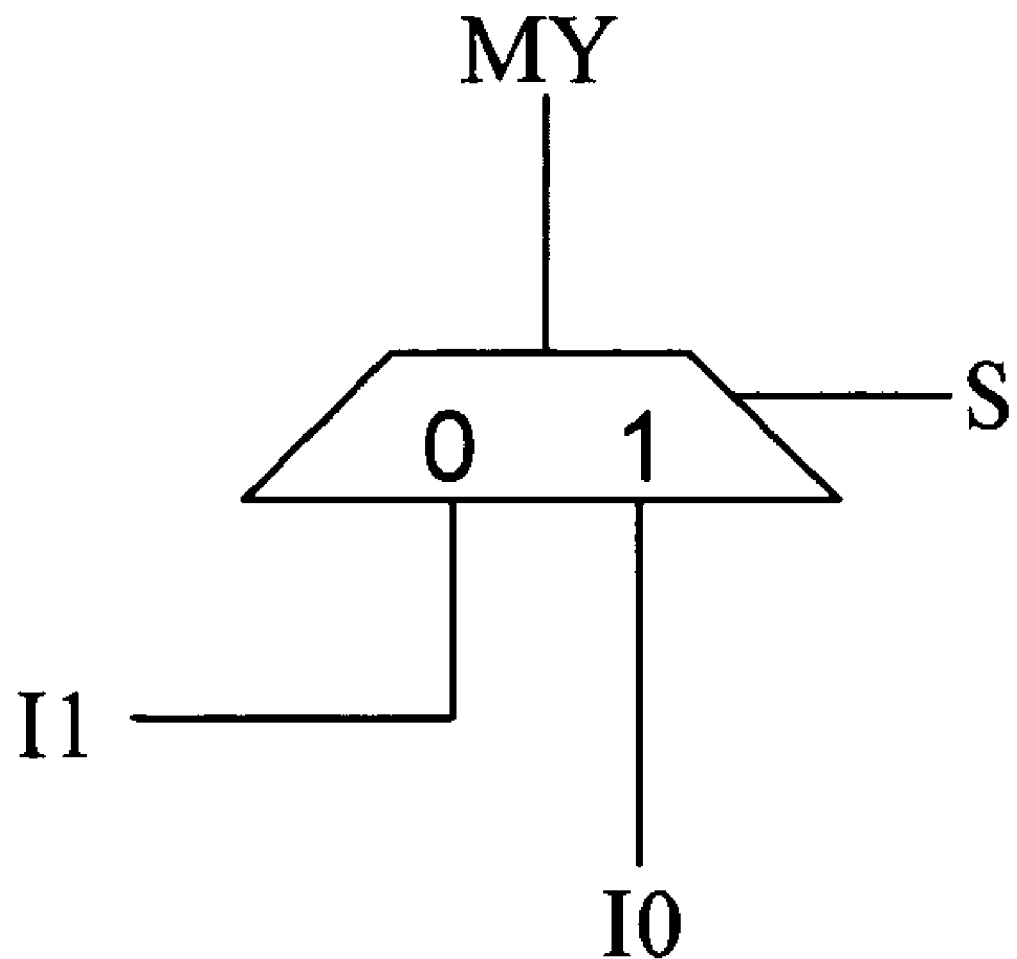
FIG. 1b is a schematic drawing of 2-input MUX as implemented in one embodiment of the current invention.

FIG. 1b is an implementation of a 2-input MUX (MUX2) chain programmable element; wherein the signal at S can be the output of other digital logic, programmable software application or firmware instructions coupled thereto. Hence in an FPGA application, a MUX2 chain may be implemented with other chain logic. In the case of a MUX2 chain element as depicted in FIG. 1b, the path from I0 to MY is much slower if combined with other logic elements than the path from S to MY. In such MUX2 chaining, the I0 to MY delay gets added to each level of logic processing. Input I1 and S are being fed to the block that is valid after a fixed time for all the MUX2 elements of the chain. A MUX2 chain is implemented preferably for a fast delay from I0 to MY.

In a MUX chain, typically there are other logic elements. Such elements are present in the I0 to MY path. In the current invention, the path from I0 to MY is designed to be faster by avoiding delay causing logic elements in the carry-chains.

Optionally, extra MUX2 chains may be added to build one or more larger multiplexers. It is contemplated that the largest multiplexer may be limited by the number of select lines. Since configuration bits uniquely program each decoder, combinatorial math determines how many select lines are needed for an n-input multiplexer. In FIG. 1b, Input I1 to the MUX chain element can be the output of another multiplexer, in which case the MUX2 chain thereby creates larger multiplexers.

Additionally, input I1 to the MUX2 chain can be the output of an n-input look-up-table (LUT). This MUX2 chain structure is flexible; it can also be used to implement more specific multiplexer structure such as the tristate structure depicted in FIGS. 7a and 7b. Moreover, MUX chaining provides a way to create large size LUTs. Hence, MUX chaining not only enables the ability to address larger LUTs, it also enables the creation of larger LUTs. Each element of a LUT can be addressed with a particular set of coordinate configuration bits and select line values. Input I1 to the MUX chain can be output of an n-input ROM. Larger MUX chaining further creates larger ROMs via such cascaded scheme.

Figure 6:
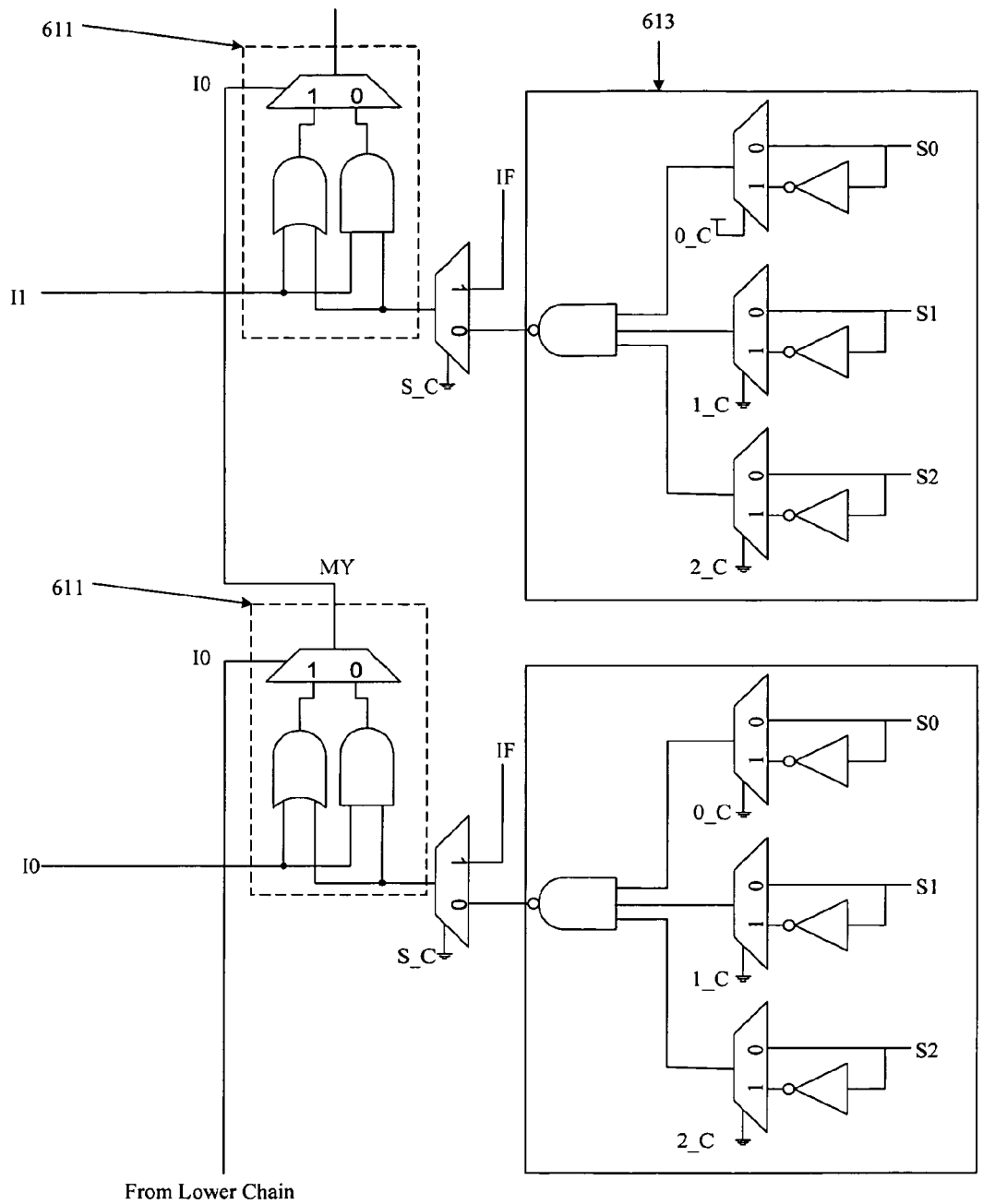
FIG. 6 is a schematic drawing of fast serial MUX chain as implemented in one embodiment of the current invention. The decoder structure 613 is shown with three select lines, S0, S1, and S2. IF is an input from a configurable logic function. The chain is optimized for a minimum delay from I0 to MY.
Figure 7A:
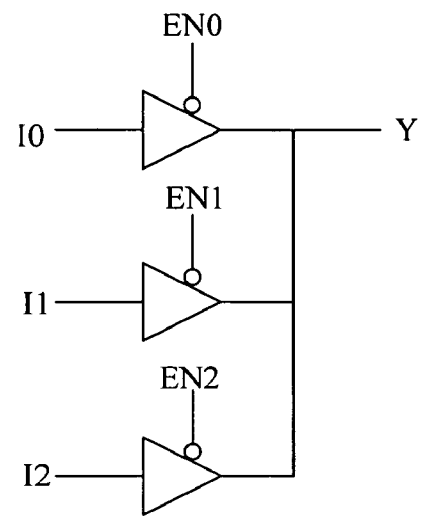
FIG. 7a is a schematic drawing of tristate logic gate to be implemented using serial MUX chaining.
Figure 7B:
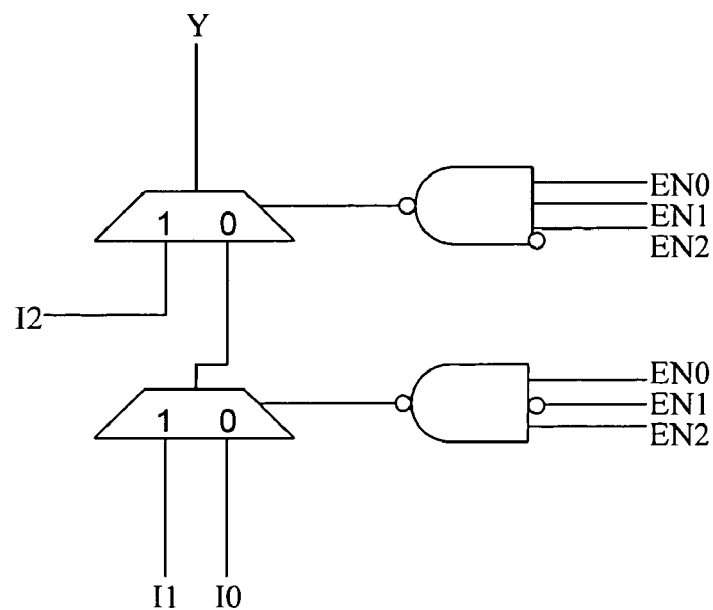
FIG. 7b is an equivalent schematic drawing of the tristate logic gate shown in FIG. 7a as implemented in one embodiment of the current invention using serial MUX chaining.

There is another input, the so-called IF signal, as called out in FIG. 6, that can flexibly control such a MUX chain. IF can be an output of one or more configurable function generators or logic sources. The IF signal can be used to implement priority multiplexer in a multiplexer chain. IF may also be generated by a look-up table output and this IF signal can be implement an arbitrary function to build complex priority multiplexers.

FIG. 5a shows logic equation representing two logical outcomes as defined by setting configuration bit 10 to either of two possible settings in a faster implementation of FPGA serial MUX chain. FIG. 5b schematic drawing represents a faster implementation in FPGA using a serial MUX chain element augmented with AND gate 512 on one input of MUX2 511 and OR gate 513 on the other. FIG. 5b is the schematic representation of the logic equation in FIG. 5b. FIG. 5c is typical design element used to reduce the delay addition as accrued from the path through the various logical elements of the circuit. By eliminating effectively one or more delay elements, the path from I0 to MY is made comparatively faster to alternative approaches or currently in circuit approaches. This structure is noted to have a high level of utility in typical configurable logic design due to the fast path from I0 to MY. By moving I0 to the select line of the MUX, and the shift register to one input of each logical element, the path from I0 to MY is made much faster than if the signal had to traverse the additional logical elements coupled to the inputs of the MUX.

FIG. 6 schematic drawing represents a fast serial MUX chain as implemented in one embodiment of the present invention. In this case the MUX chain element is constructed by a decoder structure 613 coupled to one input of a MUX2 that is coupled to a fast MUX chain element 611 at its output. Here, the other input of the aforementioned MUX2 coupling 613 and 611, is coupled to the IF signal, thus providing for an externally programmable fast priority multiplexer.

Figure 8A:
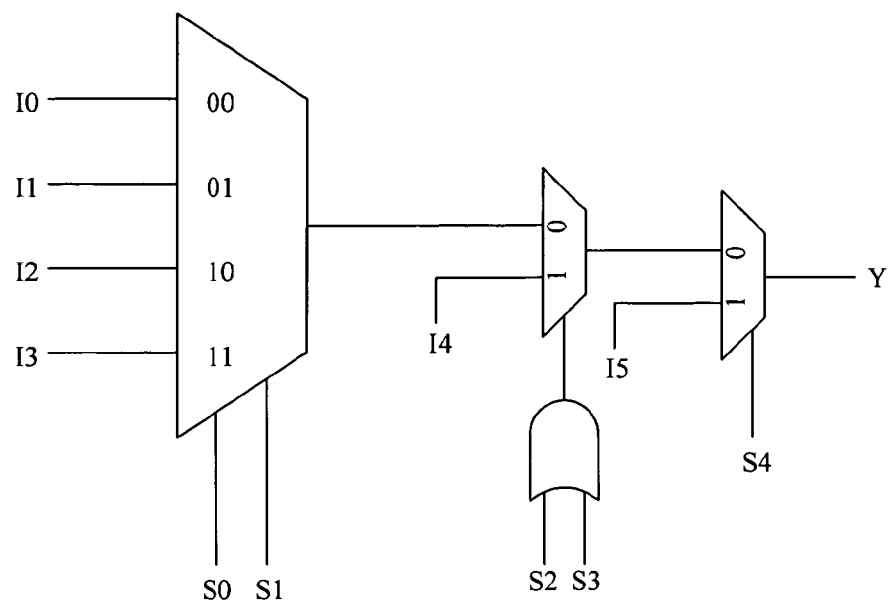
FIG. 8a is a schematic drawing of 6-input multiplexer structure to be implemented using serial MUX chaining.
Figure 8B:
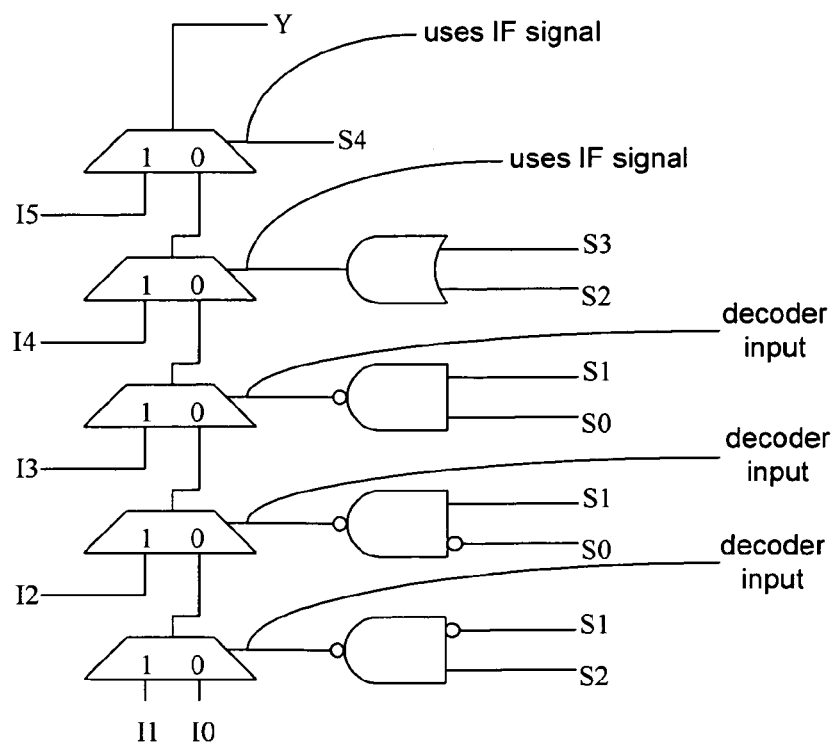
FIG. 8b is an equivalent schematic drawing of the 6-input multiplexer shown in FIG. 8a as implemented in one embodiment of the current invention using serial MUX chaining.

FIG. 8a schematic drawing shows a 6-input multiplexer structure. FIG. 8b schematic drawing shows 6-input multiplexer constructed with MUX2 chain elements.

FIG. 8b illustrate the use of MUX2 chaining, as implemented in one embodiment of the present invention, to construct an equivalent circuit to that depicted in FIG. 8a. FIG. 8b uses IF signal in some places to implement the priority selector as shown in FIG. 8a.

Figure 9:
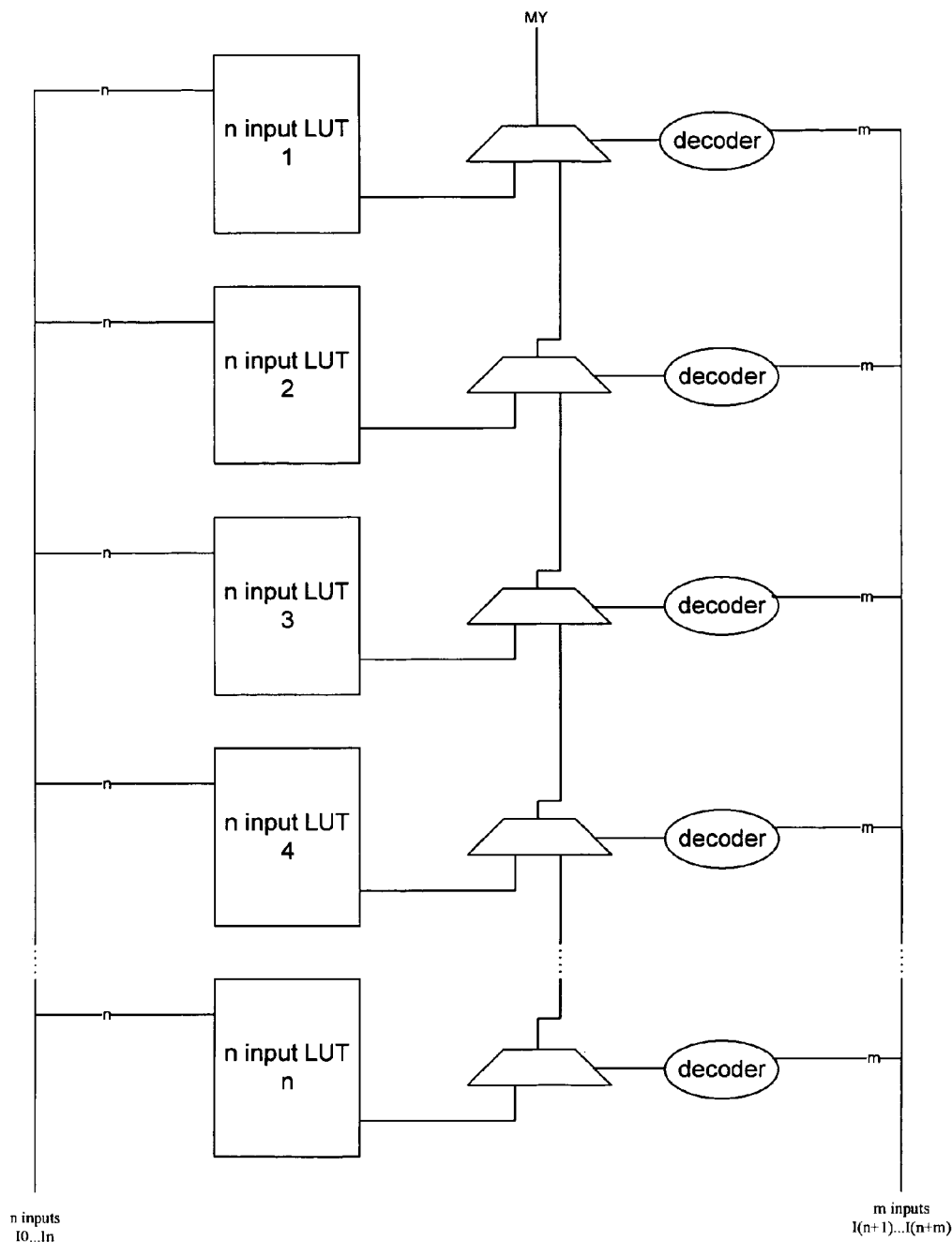
FIG. 9 shows an (n+m)-input look-up table (LUT) implemented with n n-input LUT's and m select lines using serial MUX chain as implemented in one embodiment of the current invention.

FIG. 9 schematic drawing depicts a (n+m) LUT implemented using n n-input LUTs, m select line decoders and serial chain MUXs as implemented in one embodiment of the present invention. FIG. 9 illustrates how serial MUX chaining can be used to implement large LUTs.

Foregoing descriptions of specific embodiments of the invention have been presented for purposes of illustration and description. They are not intended to be exhaustive or to limit the invention to the precise forms disclosed. Modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

We claim:

1. A configurable circuit comprising:
means for performing a multi-input decoder logic NAND function;
one or more 2-to-1 multiplexers;
one or more inverters; and
means for writing configuration bits into the select lines of said multiplexers; wherein one or more of the inputs of said means for performing a multi-input combinational logic NAND function is coupled to the output of one of said 2-to-1 multiplexers to which a single connection is coupled to inputs of said multiplexer, wherein one pathway is coupled to one of said multiplexer inputs and the other is coupled to one of said inverters to the other of said multiplexer inputs.

2. The configurable circuit of claim 1 wherein;
the means for performing a multi-input combinational logic NAND function comprises a NAND gate.

3. The configurable circuit of claim 1 wherein:
said means for writing configuration bits into the select lines of said multiplexers comprises memory configuration bits written into at power-on.

4. The configurable circuit of claim 1 wherein:
the means for writing configuration bits comprises a programmable software instruction for writing the configuration bits.

5. The configurable circuit of claim 1 wherein:
the means for performing a multi-input combinational logic NAND function is coupled to a configurable function generator to enable programmable control thereof.

6. The configurable circuit of claim 1 wherein:
one or more of the multiplexers is configured to generate a tristate or priority output.

7. The configurable circuit of claim 1 wherein:
one or more of the inputs is provided by a Read-only Memory (ROM) or a look-up table (LUT).

8. A configurable circuit comprising:
a plurality of multiplexers coupled serially to at least one other such multiplexer, wherein an output of an $n^{th}$ multiplexer is coupled to one input of an $(n+1)^{th}$ multiplexer, and a select line of at least one such multiplexers is coupled to a decoder or a configurable function generator; and
one or more of the multiplexers is configured to generate a tristate or priority output.

9. The configurable circuit of claim 8 wherein:
one or more of the multiplexers is coupled to one or more configuration bits during a power-on condition.

10. The configurable circuit of claim 8 wherein:
one or more of the multiplexers is configured using a programmable software instruction for writing one or more configuration bits thereto.

11. The configurable circuit of claim 8 wherein:
one or more of the multiplexers is coupled to a configurable function generator to enable programmable control thereof.

12. The configurable circuit of claim 8 wherein:
one or more of the multiplexer is coupled to a Read-only Memory (ROM) or a look-up table (LUT).

13. An N-to-1 configurable circuit comprising:
N input signal lines, $I_N[N:0 \ldots (N-1)]$;
N 2-to-1 multiplexers, $MUX_N[N:O \ldots (N-1)]$, each multiplexer having a first input for coupling to a first input signal line in N input signal lines, a second input for coupling to a second input signal line in N input signal lines, an output and a select output; and
N decoders or configurable function generators, each such decoder coupling to the select output of a respective 2-to-1 multiplexer in the N 2-to-1 multiplexers, comprising:
means for performing a combinational logic NAND function of its inputs;
2-to-1 multiplexers coupled to the inputs of said means for performing NAND function, each multiplexer having a first input, a second input, an output, a select input, and inverters; and
means for writing configuration bits $C_n$ into the select lines of a multiplexer $MUX_n$; wherein an $n^{th}$ input of said means for performing a combinational logic NAND function is coupled to an output of the $MUX_n$; wherein select signal $S_n$ is coupled to the first and second inputs of the multiplexer $MUX_n$; wherein signal $S_n$ is coupled to a first input of multiplexer $MUX_n$ and coupled to one of said inverters to a second input of multiplexer $MUX_n$, wherein an output of multiplexer $MUX_m$ is connected to a first input of multiplexer $MUX_{m+1}$; a select line of the multiplexer $MUX_m$ being coupled to the output of the $m^{th}$ decoder; input signal IO being coupled to a first input of MUX0; and input signal $I_m$ being coupled to a second input of $MUX_{(m-1)}$.

14. The configurable circuit of claim 13 wherein:
one or more configuration bits are provided to the means for writing configuration bit during a power-on condition.

15. The configurable circuit of claim 13 wherein:
a programmable software instruction for writing one or more configuration bits is coupled to the means for writing configuration bit.

16. The configurable circuit of claim 13 wherein:
a configurable function generator to enable programmable control is coupled to the means for performing a three-input combinational logic NAND function.

17. The configurable circuit of claim 13 further comprising:
means for generating a tristate or priority output.

18. The configurable circuit of claim 13 wherein:
one or more of the multiplexers is coupled to a Read-only Memory (ROM) or a look-up table (LUT).

19. A configurable circuit comprising:
a first multiplexer;
a second multiplexer; and
one or more of the multiplexers is configured to generate a tristate or priority output;
wherein the first multiplexer is coupled serially to the second multiplexer, such that one or more programmable decoder structure couples separately to each such multiplexer for implementing functionally therefor a programmable logic.

20. The configurable circuit of claim 19 wherein:
one or more configuration bits are applied to select lines of said multiplexers at a power-on event.

21. The configurable circuit of claim 19 wherein:
a programmable software writes one or more configuration bits to the multiplexers.

22. The configurable circuit of claim 19 wherein:
a configurable function generator is coupled to the programmable decoder structure to enable programmable control thereof.

23. The configurable circuit of claim 19 wherein:
one or more of inputs to the multiplexers is provided by a Read-only Memory (ROM) or a look-up table (LUT).

* * * * *

UNITED STATES PATENT AND TRADEMARK OFFICE
CERTIFICATE OF CORRECTION

PATENT NO. : 7,358,761 B1
APPLICATION NO. : 11/040633
DATED : April 15, 2008
INVENTOR(S) : Sunkavalli et al.

It is certified that error appears in the above-identified patent and that said Letters Patent is hereby corrected as shown below:

On the title page item (73), should read
Assignee: Cswitch Corporation (Santa Clara, CA)

Signed and Sealed this

Twelfth Day of August, 2008

JON W. DUDAS
*Director of the United States Patent and Trademark Office*